(12) United States Patent
Choi et al.

(10) Patent No.: US 10,283,039 B2
(45) Date of Patent: May 7, 2019

(54) SHIFT REGISTER UNIT AND DRIVING METHOD, GATE DRIVE CIRCUIT, AND DISPLAY APPARATUS

(71) Applicant: BOE TECHNOLOGY GROUP CO., LTD., Beijing (CN)

(72) Inventors: Hyunsic Choi, Beijing (CN); Seungwoo Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 231 days.

(21) Appl. No.: 15/529,731

(22) PCT Filed: Nov. 4, 2016

(86) PCT No.: PCT/CN2016/104528
§ 371 (c)(1),
(2) Date: May 25, 2017

(87) PCT Pub. No.: WO2017/097069
PCT Pub. Date: Jun. 15, 2017

(65) Prior Publication Data
US 2017/0365204 A1    Dec. 21, 2017

(30) Foreign Application Priority Data
Dec. 9, 2015 (CN) .......................... 2015 1 0903753

(51) Int. Cl.
*G11C 19/00* (2006.01)
*G09G 3/20* (2006.01)
(Continued)

(52) U.S. Cl.
CPC ............ *G09G 3/2092* (2013.01); *G09G 3/20* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS 8,040,293 B2 * 10/2011 Jeong .................... G11C 19/184
345/100
8,531,224 B2 * 9/2013 Iwamoto .............. G09G 3/3685
327/199
(Continued)

FOREIGN PATENT DOCUMENTS

CN         1892798 A    1/2007
CN       102063874 A    5/2011
(Continued)

OTHER PUBLICATIONS

Second Office Action in the Chinese Patent Application No. 201510903753.8, dated Oct. 17, 2017; English translation attached.
(Continued)

*Primary Examiner* — Tuan T Lam
(74) *Attorney, Agent, or Firm* — Intellectual Valley Law, P.C.

(57) ABSTRACT

The present application discloses an N-th shift register unit circuit including at least a gate-drive signal output sub-circuit, a pull-up control sub-circuit, and a pull-down control sub-circuit respectively connected between a pull-up node and a pull-down node and provided with a p-th clock signal in addition to an n-th clock signal. A driving method includes controlling the pull-down node at turn-off voltage level when the p-th clock signal is at turn-on voltage level during which the n-th clock signal is correspondingly rising to turn-on voltage level from turn-off voltage level.

20 Claims, 4 Drawing Sheets

(51) Int. Cl.
   *G11C 19/28* (2006.01)
   *G09G 3/36* (2006.01)
(52) U.S. Cl.
   CPC .......... *G09G 2310/0267* (2013.01); *G09G 2310/0286* (2013.01); *G09G 2310/08* (2013.01); *G09G 2320/0247* (2013.01); *G09G 2320/043* (2013.01)

(56) References Cited

U.S. PATENT DOCUMENTS

| | | | | |
|---|---|---|---|---|
| 8,587,508 B2* | 11/2013 | Iwase | ............ | G09G 3/3677 345/100 |
| 8,766,958 B2* | 7/2014 | Zhang | ............ | G09G 3/3677 345/204 |
| 9,478,310 B2* | 10/2016 | Han | ............ | G09G 3/20 |
| 2004/0227718 A1* | 11/2004 | Park | ............ | G09G 3/3677 345/100 |
| 2006/0146978 A1* | 7/2006 | Jang | ............ | G09G 3/3677 377/64 |
| 2007/0001991 A1 | 1/2007 | Jang et al. | | |
| 2012/0163528 A1 | 6/2012 | Jang et al. | | |
| 2012/0194489 A1 | 8/2012 | Iwamoto et al. | | |
| 2012/0200544 A1 | 8/2012 | Iwamoto et al. | | |
| 2012/0327057 A1* | 12/2012 | Sakamoto | ............ | G11C 19/184 345/211 |
| 2014/0119491 A1* | 5/2014 | Liu | ............ | G11C 19/28 377/64 |
| 2015/0243367 A1* | 8/2015 | Gu | ............ | G11C 19/28 377/64 |
| 2016/0012911 A1 | 1/2016 | Han et al. | | |
| 2016/0125847 A1* | 5/2016 | Gu | ............ | G09G 3/3677 345/205 |
| 2016/0125954 A1* | 5/2016 | Gu | ............ | G11C 19/28 377/64 |
| 2016/0133337 A1* | 5/2016 | Gu | ............ | G11C 19/28 377/64 |

FOREIGN PATENT DOCUMENTS

| | | |
|---|---|---|
| CN | 102543004 A | 7/2012 |
| CN | 102598144 A | 7/2012 |
| CN | 102598145 A | 7/2012 |
| CN | 102782742 A | 11/2012 |
| CN | 103761937 A | 4/2014 |
| CN | 104332181 A | 2/2015 |
| KR | 20130135629 A | 12/2013 |

OTHER PUBLICATIONS

International Search Report & Written Opinion dated Jan. 26, 2017 regarding PCT/CN2016/104528.
First Office Action in the Chinese Patent Application No. 201510903753.8, dated Mar. 2, 2017; English translation attached.

* cited by examiner

SHIFT REGISTER UNIT AND DRIVING METHOD, GATE DRIVE CIRCUIT, AND DISPLAY APPARATUS

CROSS-REFERENCE TO RELATED APPLICATION

This application is a national stage application under 35 U.S.C. § 371 of International Application No. PCT/CN2016/104528 Nov. 4, 2016, which claims priority to Chinese Patent Application No. 201510903753.8, filed Dec. 9, 2015, the contents of which are incorporated by reference in the entirety.

TECHNICAL FIELD

The present invention relates to a field of displaying, more particularly to a shift register unit and driving method, a gate drive circuit, and a display apparatus.

BACKGROUND

Shift register unit is a unit-circuit of a gate driver on array (GOA) circuit for providing a gate drive signal to a corresponding gate line to drive a row of pixels on a display panel for imago display. A conventional drive scheme is a so-called JUST scheme in which multiple clock signals, such as a first clock signal CLK1, a second clock signal CLK2, a third clock signal CLK3 or CLK4, are sequentially inputted with turn-on voltage level into the shift register unit. At the moment when a clock signal with turn-on voltage level ends its input phase, a next clock signal with turn-on voltage level immediately starts its input phase (without any overlap) for adjusting each signal cycle and possible interval between adjacent signals. As an output from an output thin-film transistor (TFT) of one-stage shift register unit, which is originated from a clock signal CLKn, is inputted into a next-stage shift register unit, a coupling noise may be generated in the gate drive signal associated with the particular driving clock signal. For example, undesired multiple-outputs of gate drive signals may occur. Conventional shift register includes a TFT for controlling pull-down node potential to prevent such incorrect multiple-outputs of gate drive signals. But as this TFT is deteriorated over the driving voltage and is heated over time, the reliability of the TFT becomes poorer and the coupling noise issue will be worse, causing image flickers or other malfunctions in the display panel based on the conventional shift register unit. The longer of the clock signal driving time used in the conventional shift register unit, the earlier these malfunctions will occur.

SUMMARY

In one aspect, the present disclosure provides a method of driving a shift register unit, wherein the shift register unit is an N-th unit cascaded in the multi-stage gate driving circuit, wherein N is a positive integer, the N-th unit comprising, an N-th gate-drive signal output port; a gate-drive output sub-circuit including a capacitor connected between a pull-up node and the N-th gate-drive signal output port, and configured to output an n-th clock signal at the N-th gate drive signal output port, wherein n to be a remainder of N divided by 4 or n=4 if N is divisible by 4; a pull-up control sub-circuit connected to an (N−1)th gate-drive signal output port of a previous adjacent (N−1)th unit, a pull-down node, the pull-up node, and a fixed voltage, port set to turn-off voltage level, and controlled by a m-th clock signal, wherein m is a remainder of (n+2) divided by 4 or equal, to 4 if (n+2) is divisible by 4; and a pull-down control sub-circuit connected to the pull-up node, the fixed voltage port set to turn-off voltage level, the (N−1)th gate-drive signal output port, and the pull-down node, and controlled by the n-th clock signal and a p-th clock signal, wherein p is a remainder of (n+3) divided by $ or equal to 4 if (n+3) is divisible by 4; the method comprising controlling the p-th clock signal at turn-on voltage level during a time period corresponding to a rising edge of the n-th clock signal during which the n-th clock signal changes from turn-off voltage level to turn-on voltage level; controlling the pull-down node to be set to turn-on voltage level when the p-th clock signal is at turn-on voltage level; and resetting potential level of the N-th gate-drive signal output port to turn-off voltage level.

Optionally, the method further comprises setting the pull-up node to turn-on voltage level when receiving a turn-on voltage level signal from the (N−1)-th gate-drive signal output port, and setting the pull-up node to turn-off voltage level when the pull-down node or the m-th clock signal is at turn-on voltage level.

Optionally, the method further comprises setting the pull-down node to turn-off voltage level when the pull-up node, the (N−1)-th gate-drive signal output port, or the n-th clock signal is set to turn-on voltage level, and setting the pull-down node to turn-on voltage level when the p-th clock signal is set to turn-on voltage level.

Optionally, the pull-down control sub-circuit comprises a first pull-down control transistor having a gate connected to the pull-up node, a first terminal connected to the pull-down node, and a second terminal set to turn-off voltage level; a second pull-down control transistor having a gate connected to the (N−1)-th gate-drive signal output port, a first terminal connected to the pull-down node, and a second terminal set to turn-off voltage level; a third pull-down control transistor having a gate connected to the n-th clock signal, a first terminal connected to the pull-down node, and a second terminal set to turn-off voltage level; and a first reset transistor having a gate and a first terminal commonly provided with the p-th clock signal, and a second terminal connected to the pull-down node.

Optionally, the pull-up control sub-circuit comprises an input transistor having a gate and a first terminal commonly connected to the (N−1)-th gate-drive signal output port, and a second terminal connected to the pull-up node; a pull-up control transistor having a gate connected to the pull-down node, a first terminal connected to the pull-up node, and a second terminal set to turn-off voltage level; a second reset transistor having a gate receiving the n-th clock signal, a first terminal connected to the pull-up node, and a second terminal set to turn-off voltage level; and a third reset transistor having a gate connected to an (N+3)-th carry signal output port of a (N+3)-th unit, a first terminal connected to the pull-up node, and a second terminal set to turn-off voltage level.

Optionally, the gate-drive output sub-circuit comprises an output pull-up transistor having a gate connected to the pull-up node, a first terminal receiving the n-th clock signal, and a second terminal connected to the N-th gate-drive signal output port; an output pull-down transistor having a gate connected to the pull-down node, a first terminal connected to the N-th gate-drive signal output port, and a second terminal set to turn-off voltage level; and a fourth reset transistor having a gate connected to the (N+3)-th carry signal output port, a first terminal connected to the N-th gate-drive signal output port, and a second terminal set to turn-off voltage level.

Optionally, the N-th unit further comprises a carry signal output sub-circuit alternatively connected to the pull-up node and the pull-down node and controlled by the n-th clock signal to output a carry signal at an N-th carry signal output port.

Optionally, the carry signal output sub-circuit comprises a carry pull-up transistor having a gate connected to the pull-up node, a first terminal receiving the n-th clock signal, and the second terminal connected to the N-th gate-drive signal output port; and a carry pull-down transistor having a gate connected to the pull-down node, a first terminal connected to the N-th carry signal output port, and a second terminal set to turn-off voltage level.

Optionally, the method further comprises outputting the nth clock signal at the N-th carry signal output port when the pull-up node is at turn-on voltage level and outputting a turn-off voltage level signal at the N-th carry signal output port when the pull-down node is at turn-on voltage level.

Optionally, the method further comprises controlling resetting of potential level at the pull-up node and the N-th gate-drive signal output port to turn-off voltage level when the (N+3)-th carry signal output port outputs a turn-on voltage level signal.

Optionally, each of the n-th clock signal, the m-th clock signal, and the p-th clock signal comprises a duty cycle of ⅓ corresponding to a same period of T; the n-th clock signal being delayed by 0.5 T compared with the n-th clock signal; and the p-th clock signal being delayed by 0.75 T compared with the n-th clock signal.

Optionally, the (n=2) clock signal is delayed by T/4 compared with the (n=1) clock signal; and the (n=1) clock signal comprises turn-on voltage level during a first time period and the (n=2) clock signal comprises turn-on voltage level during a second time period, a last ¼ portion of the first time period overlaps with a first ¼ portion of the second time period.

Optionally, each of the first pull-down control transistor, the second pull-down control transistor, the third pull-down control transistor, the first reset transistor, the input transistor, the pull-up control transistor, the second reset transistor, the third reset transistor, the output pull-up transistor, the output pull-down transistor, the fourth reset transistor, the carry pull-up transistor, and the carry pull-down transistor is a n-type transistor.

In another aspect, the present disclosure provides a shift register unit cascaded in a multi-stage gate driving circuit, wherein the shift register unit is an N-th unit cascaded in the multi-stage gate driving circuit, wherein N is a positive integer, the N-th unit comprising an N-th gate-drive signal output port; a gate-drive output sub-circuit including a capacitor connected between a pull-up node and the N-th gate-drive signal output port, and configured to control outputting of an nth clock signal at the N-th gate drive signal output port when the pull-up node is at high voltage level, and to set low voltage level at the N-th gate-drive signal output port when a pull-down node is at high voltage level or an (N+3)-th carry signal output port of a (N+3)-th unit outputs a high voltage level signal, n being a remainder of N divided by 4 or equal to 4 if N is divisible by 4; a carry signal output sub-circuit configured to control outputting of the nth clock signal at the N-th carry signal output port when the pull-up node is at high voltage level and to control outputting of a low voltage level signal at an N-th carry signal output port when the pull-down node is at high voltage level; a pull-up control sub-circuit connected to an (N−1)th gate-drive signal output port of a previous adjacent (N−1)th unit, a pull-down node, the pull-up node, and a fixed voltage port set to turn-off voltage level, and configured to set the pull-up node to high voltage level when a high voltage level signal is outputted at the (N−1)-th gate-drive signal output port from a previous adjacent shift register unit, and to set the pull-up node to low voltage level when the pull-down node, a m-th clock signal, or the (N+3)-th carry signal output port is at high voltage, level, M being a remainder of (n+2) divided by 4 or equal to 4 if (n+2) is divisible by 4; a pull-down control sub-circuit connected to the pull-up node, the fixed voltage port set to turn-off voltage level, the (N−1)th gate-drive signal output port, and the pull-down node, and configured to set the pull-down node to low voltage level when the pull-up node, the (N−1)-th gate-drive signal output port, or the n-th clock signal is set to high voltage level, and to set the pull-down node to high voltage level when a p-th clock signal is set to high voltage level, p being a remainder of (n+3) divided by 4 or equal to 4 if (n+3) is divisible by 4; and a clock signal generator configured to generate the n-th clock signal, the m-th clock signal, and the p-th clock signal; wherein the p-th clock signal is at high voltage level when the n-th clock signal is on a rising edge from low voltage level to high voltage level.

Optionally, the pull-down control sub-circuit comprises a first pull-down control transistor having a gate connected to the pull-up node, a first terminal connected to the pull-down node, and a second terminal set to turn-off voltage level; a second pull-down control transistor having a gate connected to the (N−1)-th gate-drive signal output port, a first terminal connected to the pull-down node, and a second terminal set to turn-off voltage level; a third pull-down control transistor having a gate connected to the n-th clock signal, a first terminal connected to the pull-down node, and a second terminal set to turn-off voltage level; and a first reset transistor having a gate and a first terminal commonly provided with the p-th clock signal, and a second terminal connected to the pull-down node.

Optionally, the pull-up control sub-circuit comprises an input transistor having a gate and a first terminal commonly connected to the (N−1)-th gate-drive signal output port, and a second terminal connected to the pull-up node; a pull-up control transistor having a gate connected to the pull-down node, a first terminal connected to the pull-up node, and a second terminal set to turn-off voltage level; a second reset transistor having a gate receiving the m-th clock signal, a first terminal connected to the pull-up node, and a second terminal set to turn-off voltage level; and a third reset transistor having a gate connected to the (N+3)-th carry signal output port, a first terminal connected to the pull-up node, and a second terminal set to turn-off voltage level.

Optionally, the gate-drive output sub-circuit comprises an output pull-up transistor having a gate connected to the pull-up node, a first terminal receiving the n-th clock signal, and a second terminal connected to the N-th gate-drive signal output port; an output pull-down transistor having a gate connected to the pull-down node, a first terminal connected to the N-th gate-drive signal output port, and a second terminal set to turn-off voltage level; and a fourth reset transistor having a gate connected to the (N+3)-th carry signal output port, a first terminal connected to the N-th gate-drive signal output port, and a second terminal set to turn-off voltage level.

Optionally, each of the n-th clock signal, the m-th clock signal, and the p-th clock signal comprises a duty cycle of ⅓ corresponding to a same period of T; the m-th clock signal being delayed by 0.5 T compared with the n-th clock signal; and the p-th clock signal being delayed by 0.75 T compared with the n-th clock signal.

In another aspect, the present disclosure provides a gate drive circuit comprising M numbers of shift register units cascaded in a multi-stage series, each of the M numbers of shift register units is the shift register unit described herein, M is an integer equal to or greater than N.

In another aspect, the present disclosure provides a display apparatus comprises a gate drive circuit described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
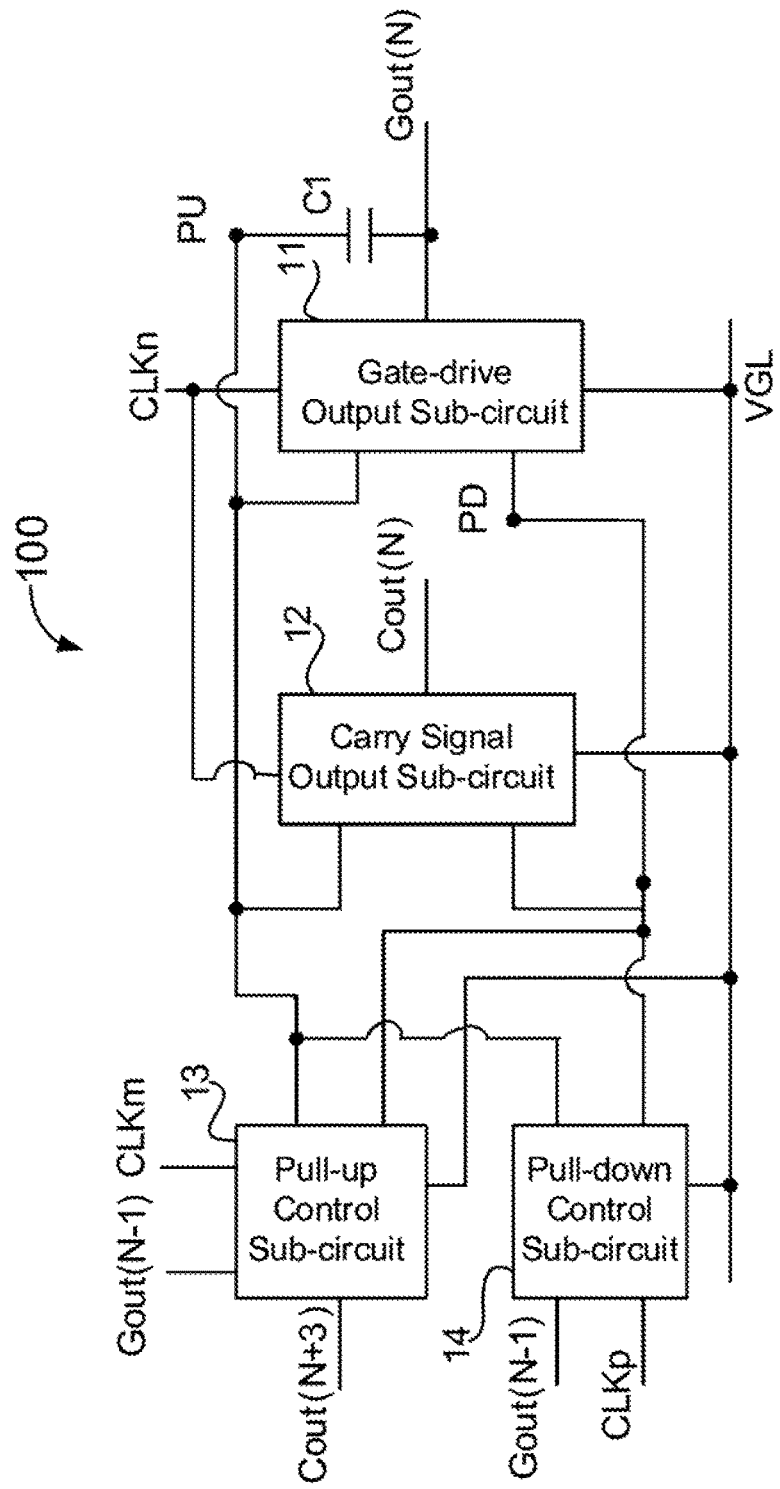
FIG. 1 is a simplified block diagram of a shift register unit according to some embodiments.

The disclosure will now describe more specifically with reference to the following embodiments. It is to be noted that the following descriptions of same embodiments are presented herein for purpose of illustration and description only. It is not intended to be exhaustive or to be limited to the precise form disclosed.

The present disclosure provides, inter alia, a shift register unit and driving method, a gate drive circuit, and a display apparatus that substantially obviate one or more of the problems due to limitations and disadvantages of the related art. In one aspect, the present disclosure provides a shift register unit cascaded in a multi-stage gate driving circuit, in which the shift register unit is art N-th unit cascaded in the multi-stage gate driving circuit, wherein N is a positive integer. In some embodiments, the shift register unit includes an N-th gate-drive signal output port and an N-th carry signal output port; a capacitor having a first terminal connected to a pull-up node and a second terminal connected to the N-th gate-drive signal output port a gate-drive output sub-circuit configured to control outputting of an n-th clock signal at the N-th gate drive signal output port when the pull-up node is at turn-o voltage level, and to set turn-off voltage level at the N-th gate-drive signal output port when a pull-down node is at turn-on voltage level or a (N+3)-th carry signal output port of a (N+3)-th shift register unit outputs a turn-on voltage level signal, n being a remainder of N divided by 4 or equal to 4 if N is divisible by 4; a carry signal output sub-circuit configured to control outputting of the n-th clock signal at the N-th carry signal output port when the pull-up node is at turn-on voltage level and to control outputting off turn-off voltage level signal at the N-th carry signal output port when the pull-down node is at turn-on voltage level; a pull-up control sub-circuit configured to set the pull-up node to turn-on voltage level when a turn-on voltage level signal is outputted at a (N−1)-th gate-drive signal output port from a previous adjacent shift register unit, and to set the pull-up node to turn-off voltage level when the pull-down node, a m-th clock signal, or the (N+3)-th carry signal output port is at turn-on voltage level, m being a remainder of (n+2) divided by 4 or equal to 4 if (n+2) is divisible by 4; and a pull-down control node configured to set the pull-down node to turn-off voltage level when the pull-up node, the (N−1)-th gate-drive signal output port, or the n-th clock signal is set to turn-on voltage level, and to set the pull-down node to turn-on voltage level when a p-th clock signal is set to turn-on voltage level, p being a remainder of (n+3) divided by 4 or equal to 4 if (n+3) is divisible by 4. Optionally, the shift register unit further includes a clock signal generator for generating the n-th clock signal, the m-th clock signal, and the p-th clock signal. The p-th clock signal is at turn-on voltage level during a time period corresponding to a rising edge of the n-th clock signal during which the n-th clock signal changes from turn-off voltage level to turn-on voltage level.

FIG. 1 is a simplified block diagram of a shift register unit according to some embodiments of the present disclosure. Referring to FIG. 1, a shift register unit 100 is provided as an N-th unit arbitrarily selected from multiple redundant units cascaded in a multi-stage series for forming a gate driver on array (GOA) circuit implemented for driving a plurality of pixels on a display panel, N is a positive integer. The N-th shift register unit 100 includes an N-th gate-drive signal output port Gout(N), an N-th carry signal output port Cout(N), and receives multiple clock signals such as CLKn, where n varies from 1 through 4. These clock signals are pulse voltage signals with corresponding cycle period and interval or delay time provided by a system controller for operating the display panel.

Further, the shift register unit 100 includes a capacitor C1 having a first terminal connected to a pull-up node PU and a second terminal connected to the N-th gate-drive signal output port Gout(N).

The shift register unit 100 also includes a gate-drive signal output sub-circuit 11 configured to control outputting of the n-th clock signal CLKn at the N-th gate-drive signal output port Gout(N) when the pull-up node PU is set to turn-on voltage level, and to set turn-off voltage level at the N-th gate-drive signal output port Gout(N) when a pull-down node PD is set to turn-on voltage level or when a (N+3)-th carry signal output port Cout(N+3) outputs turn-on voltage level. The turn-on voltage level represents a potential level that is able to turn a corresponding control transistor into a conduction state. In some cases, it is also called turn-on voltage level. Conversely, turn-off voltage level represents a turn-off voltage level, making a corresponding transistor into a block state. Note, the (N+3)-th carry signal output port Cout(N+3), namely, is an output port of a carry signal output sub-circuit of the (N+3)-th shift register unit that is also one unit cascaded in the same multi-stage series. In particular, the gate-drive signal output sub-circuit 11 of the N-th shift register unit 100 is configured under the following restriction for the n-th clock signal CLKn: n is a remainder of N divided by 4 or n=4 if N is divisible by 4.

Additionally, the N-th shift register unit 100 includes a carry signal output sub-circuit 12 configured to control outputting of the n-th clock signal CLKn at the N-th carry signal output port Cout(N) when the pull-up node PU is set to turn-on voltage level, and to set turn-off voltage level at the N-th carry signal output port Cout(N) when the pull-down node PD is at turn-on voltage level.

Furthermore, the N-th shift register unit 100 includes a pull-up control sub-circuit 13 configured to set the pull-up node PU at turn-on voltage level when the pull-up control sub-circuit 13 receives an input signal at turn-on voltage level outputted from the (N−1)-th gate-drive signal output port Gout(N−1), and to control the pull-up node PU to be set to turn off voltage level when either the pull-down node PD is at turn-on voltage level, or when an m-th clock signal CLKm is set at turn-on voltage level, or when the pull-up control sub-circuit 13 receives an input signal at turn-on voltage level outputted from the (N+3)-th carry signal output port of the (N+3)-th shift register unit. Again, the pull-up control sub-circuit 13 is configured under the following restriction for the clock signal CLKm in association with the clock signal CLKn: m is a remainder of (n+2) divided by 4 or m=4 if (n+2) is divisible by 4.

Moreover, the N-th shift register unit 100 includes a pull-down control sub-circuit 14 configured to set the pull-down node PD to turn-off voltage level when the pull-up node PU is set to turn-on voltage level, or when it receives an input signal at turn-on voltage level from the (N−1)-th gate-drive signal output port Gout(N−1), or when the n-th clock CLKn is set at turn-on voltage level. The pull-down-node sub-circuit 14 is also configured to control the pull-down node PD to be set to turn-on voltage level when a p-th clock signal CLKp is at turn-on voltage level under the following restriction in association with the clock signal CLKn that p is a remainder of (n+3) divided by 4 or p=4 if (n+3) is divisible by 4. Further, an additional restriction is provided such that the p-th clock signal CLKp is at turn-on voltage level during a time period corresponding to a rising edge of the n-th clock signal. CLKn during the operation of the N-th shift register unit.

As described above, by setting the CLKp signal at turn-on voltage level when the CLKn signal is rising (from turn-off voltage level) to turn-on voltage level, the shift register unit of the present disclosure is able to use turn-on voltage level of the CLKp signal to set the pull-down node PD to turn-on voltage level so as to reset potential level at the N-th gate-drive signal output port to turn-off voltage level to avoid incorrect multi-outputs thereof during the time period when the CLKn is at tune-on voltage level. The (N+3)-th carry signal output port Cout(N+3) will further reset potential levels of the N-th gate-drive signal output and the pull-up node PU to turn-off voltage level.

In a specific example of operation the shift register unit, if the shift register unit is a 10th stage unit, i.e., N=10. n is a remainder of 10 divided by 4, which is 2. Then, m=4 and p=1. In other words, in this shift register unit, the following clock signals are received: CLK2, CLK4, and CLK1. Particularly, CLKn=CLK2 is received by the gate-drive signal output sub-circuit 11, CLKm=CLK4 is received by the pull-up control sub-circuit 13. CLKp=CLK1 is received by the pull-down control sub-circuit 14. Of course, when N is other integer, there is a different combination of the clock signals that are respectively received by the corresponding sub-circuits in the shift register unit.

In some embodiments, each of the n-th clock signal CLKn, the m-th clock signal CLKm, and the p-th clock signal CLKp has an equal duty cycle of ⅓ and a same period of T, but the m-th clock signal CLKm is delayed by 0.5 T compared with the n-th clock signal CLKn and the p-th clock signal CLKp is delayed by 0.75 T compared with the n-th clock signal CLKn.

In some embodiments, through a partial overlapping setup for the adjacent clock signals, an initial portion of every high-voltage output time of the n-th clock signal CLKn overlaps with a latter portion of every high-voltage output time of the p-Iii clock signal CLKp. Thus, at a moment corresponding to every rising edge of the CLKp signal, during which the incorrect multi-outputs may be produced, the CLKp signal is always at turn-on voltage level so as to pull up the potential level at the pull-down node PD to turn-on voltage level. In turn, turn-on voltage level set at the pull-down node PD is able to pull down the N-th gate-drive signal output port to turn-off voltage level to successfully reset its potential level to turn-off voltage level to ensure that no multi-outputs event occurs.

For example, when n=2, CLKm is CLK4, CLKp is CLK1. Based on the setup of duty cycles, cycle period, and relative delay times, i.e., each of the CLK1, CLK2, CLK3 and CLK4 has a duty cycle of ⅓ and a same cycle period of T; CLK2 is delayed by T/4 relative to CLK1, CLK3 is delayed by T/4 relative to CLK2, C:LK4 is delayed by T/4 relative to CLK3, an operation timing diagram of the clock signals CLK1, CLK2 CLK3, and CLK4 is shown in FIG. 2.

Figure 2:
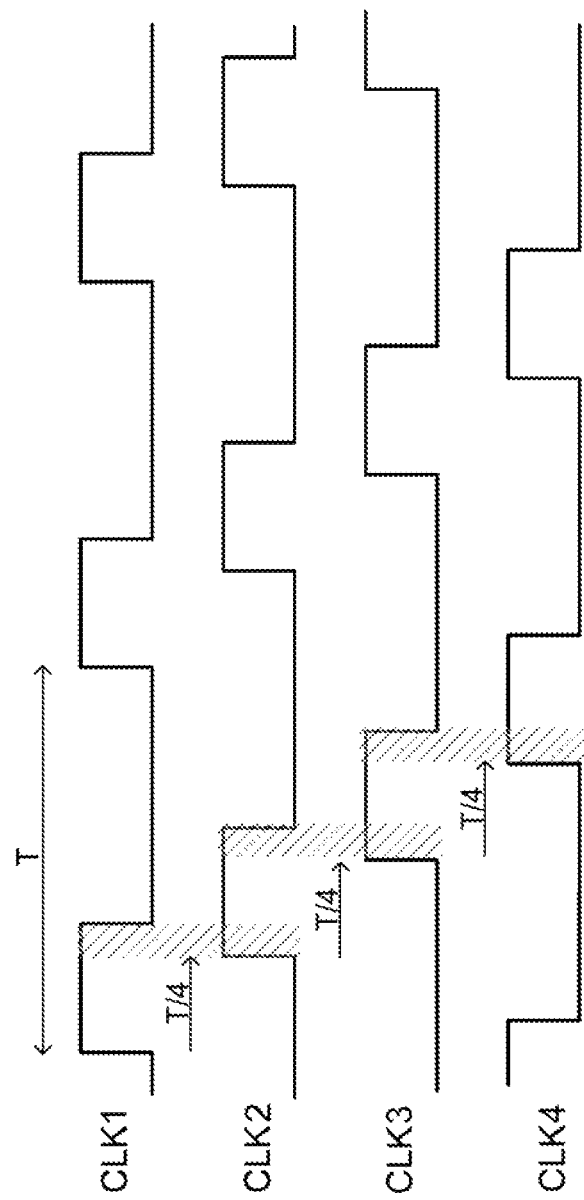
FIG. 2 is a simplified timing diagram of a first clock signal CLK1, a second clock signal CLK2, a third clock signal CLK3, and a fourth clock signal CLK4 according to an embodiment.

Referring to FIG. 2, the first ¼ portion of the high-voltage output time of CLK2 is overlapped with the latter ¼ portion of the high-voltage output time of CLK1. The overlapped portion is marked by a shadowing region in FIG. 2. The first ¼ portion of the high-voltage output time of CLK3 is overlapped with the latter ¼ portion of the high-voltage output time of CLK2, and so on.

In an embodiment, the pull-down control sub-circuit 14 includes a first pull-down control transistor, a second pull-down control transistor, a third pull-down control transistor, and a first reset transistor. The first pull-down control transistor has a gate connected to the pull-up node PU, a first terminal connected to the pull-down node PD, and a second terminal set to turn-off voltage level. The second pull-down control transistor has a gate connected to the N-th gate-drive signal output port Gout(N) a first terminal connected to the pull-down node PD, and a second terminal set to turn-off voltage level. The third pull-down control transistor has a gate receiving the n-th clock signal CLKn, a first terminal connected to the pull-down node PD, and a second terminal set to turn-off voltage level. The first reset transistor has a gate and a first terminal commonly receiving the p-th clock signal CLKp and a second terminal connected to the pull-down node PD.

In an embodiment, the pull-up control sub-circuit 13 includes an input transistor, a pull-up control transistor, a second reset transistor, and a third reset transistor. The input transistor has a gate and a first terminal commonly connected to the (N−1)-th Rate-drive signal output port Gout(N−1) and a second terminal connected to the pull-up node PU. The pull-up control transistor has a gate connected to the pull-down node PD, a first terminal connected to the pull-up node PU, and a second terminal set to turn-off voltage level. The second reset transistor has a Rate receiving a m-th clock signal CLKm, a first terminal connected to the pull-up node PU, and a second terminal set to turn-off voltage level. The third reset transistor has a gate connected to the (N+3) carry signal output port Cout(N+3), a first terminal connected to the pull-up node PU, and the second terminal set to turn-off voltage level. During the operation of the shift register unit, when the (N+3)-th carry signal output port outputs a turn-on voltage level signal that is received by the pull-up control sub-circuit 13 of the N-th shift register unit, the potential level at the pull-up node PU can be reset to turn-off voltage level.

In an embodiment, the gate-drive signal output sub-circuit 11 includes an output pull-up transistor, an output pull-down transistor, and a fourth reset transistor. The output pull-up transistor has a gate connected to the pull-up node PU, a first terminal receiving the n-th clock signal CLKn, and a second terminal connected to the N-th gate-drive signal output port Gout(N). The output pull-down transistor has a gate connected to the pull-down node PD, a first terminal connected to the N-th gate-drive signal output port Gout(N), and a second terminal set to turn-off voltage level. The fourth reset transistor has a gate connected to the (N+3)-th carry signal output port Cout(N+3), a first terminal connected to the N-th gate-drive signal output port Gout(N), and the second terminal set to turn-off voltage level. During an operation of the shift register unit, when the (N+3)-th carry signal output port Cout(N+3) outputs a turn-on voltage level signal that is received by the pull-up control sub-circuit 13, the potential level at the N-th gate-drive signal output port Gout(N) can be reset to turn-off voltage level.

In an embodiment, the can signal output sub-circuit 12 includes a carry pull-up transistor and a canny pull-down transistor. The carry pull-up transistor has a gate connected to the pull-up node PU, a first terminal receiving the n-th clock signal CLKn, and a second terminal connected to the N-th carry signal output port Cout(N). The carry pull-down transistor has a gate connected to the pull-down node PD, a first terminal connected to the N-th carry signal output port. Cout(N), and a second terminal set to turn-off voltage level.

In some embodiments, each of the first pull-down control transistor, the second pull-down control transistor, the third pull-down control transistor, the first reset transistor, the first input transistor, the pull-up control transistor, the second reset transistor, the third reset transistor, the output pull-up transistor, the output pull-down transistor, the fourth reset transistor, the carry pull-up transistor, and the carry pull-down transistor is an n-type transistor.

In some embodiments, the transistors used in the shift register circuit of the present disclosure can be thin-film transistor or field-effect transistor or other devices having the same switching-control characteristics. In the embodiments of the disclosure, in order to distinguish two terminals other than a gate of each transistor, one terminal (e.g., the first terminal) is called a source terminal and another terminal (e.g., the second terminal) is called a drain terminal. Additionally, in the present disclosure, all n-type transistors are used for illustrating the functional features of the shift register unit, although all p-type transistors can be adopted for achieving substantially the same functional features with some changes in control settings.

Figure 3:
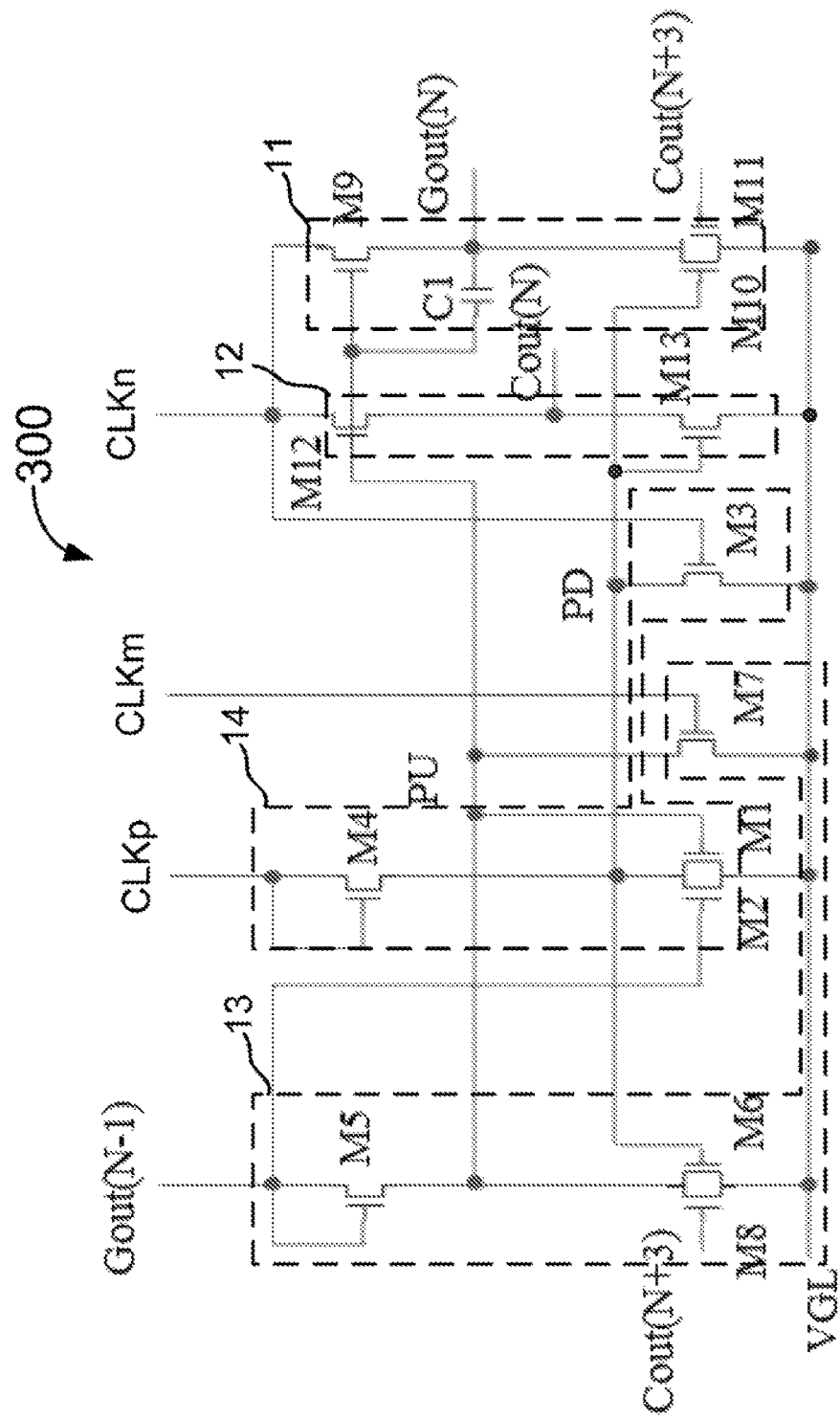
FIG. 3 is a circuit diagram of a shift register unit according to a specific embodiment.

FIG. 3 is a circuit diagram of a shift register unit according to a specific embodiment of the present disclosure. Referring to FIG. 3, a shift register unit 300 is provided as an example of the shift register unit 100. In particular, the shift register unit 300 is an N-th shift register unit of multiple redundant units cascaded to form a GOA circuit.

Referring to FIG. 3, the shift register unit 300 includes an N-th gate-drive signal output port Gout(N), an N-th carry signal output port Cout(N), and receives several clock signals CLKn, CLKm, and CLKp. For example, N=10, n=2, m=4, p=1.

The shift register unit 300 includes a gate-drive signal output sub-circuit 11, a carry signal output sub-circuit 12, a pull-up control sub-circuit 13, and a pull-down control sub-circuit 14. The shift register unit 300 is configured to set the clock signal. CLKp to turn-on voltage level during a rising moment of the clock signal CLKn (from turn-off voltage level to turn-on voltage level).

The gate-drive signal output sub-circuit 11 includes at least a capacitor C1 having a first terminal connected to a pull-up node PU and a second terminal connected to the N-th gate-drive signal output port Gout(N). The gate-drive signal output sub-circuit 11 further includes an output pull-up transistor M9, an output pull-down transistor M10, and a fourth reset transistor M11. M9 has a gate connected to the pull-up node PU, a first terminal receiving the clock signal CLKn, and a second terminal connected to the N-th gate drive signal output port Gout(N). Transistor M10 has a gate connected to the pull-down node PD, a first terminal connected to the N-th gate-drive signal output port Gout(N), and a second terminal set to turn-off voltage level VGL. Transistor M11 has a gate connected to the (N+3)-th carry signal output port Cout(N+3), a first terminal connected to the N-th gate-drive signal output port Gout(N), and a second terminal set to turn-off voltage level VGL.

The pull-down control sub-circuit 14 includes a first pall-down control transistor M1, a second pull-down control transistor M2, a third pull-down control transistor M3, and a first reset transistor M4. Transistor M1 has a gate connected to the pull-up node PU, a first terminal connected to a pull-down node PD, and a second terminal set to turn-off voltage level VGL. Transistor M2 has a gate connected to the (N−1)-th gate-drive signal output port Gout(N−1), a first terminal connected to the pull-down node PD, and a second terminal set to turn-off voltage level VGL. Transistor M3 has a gate receiving the clock signal CLKn, a first terminal connected to the pull-down node PD, and second terminal set to turn-off voltage level VGL. Transistor M4 has agate and a first terminal commonly receiving the first clock signal CLKp and a second terminal connected to the pull-down node PD.

The pull-up control sub-circuit 13 includes an input transistor M5, a pull-up control transistor M6, a second reset transistor M7, and a third reset transistor M8. Transistor M5 has a gate and a first terminal commonly connected to the (N−1)-th gate-drive signal output port Gout(N−1), and a second terminal connected to the pull-up node PU. Transistor M6 has a gate connected to the pull-down node PD, a first terminal connected to the pull-up node RI, and a second terminal set to turn-off voltage level VGL. Transistor M7 has a gate receiving a clock signal CLKm, a first terminal connected to the pull-up node PU, and a second terminal set to turn-off voltage level VGL. M8 has a gate connected to the (N+3)-th carry signal output port Cout(N+3), a first terminal connected to the pull-up node PU, and a second terminal set to turn-off voltage level VGL.

The carry signal output sub-circuit 12 includes a carry pull-up transistor M12 and a carry pull-down transistor M13. Transistor M12 has a gate connected to the pull-up node PU, a first terminal receiving the clock signal CLKn, and, a second terminal connected to the N-th carry signal output port Cout(N). Transistor M13 has a gate connected to the pull-down node PD, a first terminal connected to the N-th carry signal output port Cout(N), and a second terminal set to turn-off voltage level VGL. VGL is a fixed turn-off voltage level provided by a system controller for operating the display panel and commonly used by several sub circuits in the shift register unit 300. In some embodiments, all transistors in the shift register unit 300, from M1 to M13, are n-type transistors. Based on the circuitry for the shift register unit, its operation can be described following an operation timing diagram below.

Figure 4:
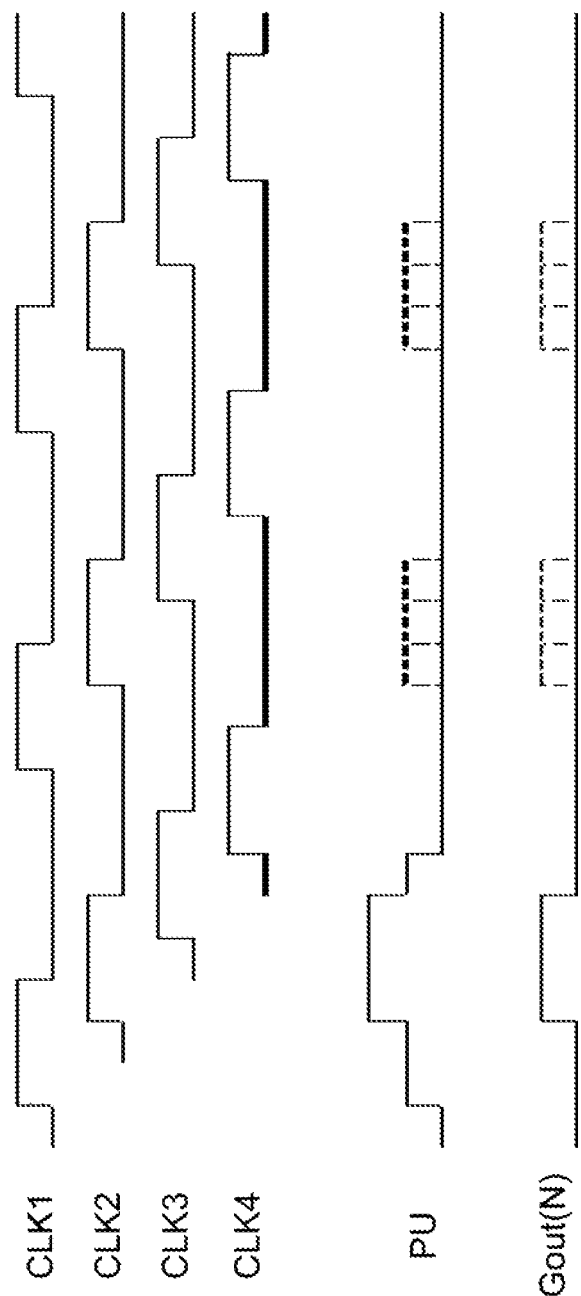
FIG. 4 is a timing diagram of operating a shift register unit of FIG. 3 of the present disclosure.

FIG. 4 is a timing diagram of operating a shift register unit of FIG. 3 of the present disclosure. Referring to FIG. 3, when operating the shift register unit 300, clock signals CLKn, CLKm, and an input port connected to the (N+3)-th carry signal output port will perform respective potential reset operations on the N-th Rate-drive signal output port Gout(N) and the pull-up node PU (especially through the port. Cout(N+3)). Referring to FIG. 4, dash lines for depicting potential levels of the pull-up node PU and port Gout(N)

are used to indicate possible incorrect multi-outputs occurred when the potential of Gout(N) is not properly reset by partial overlapping of clock signals between CLKn and CLKp. According to the shift register unit 300 proposed in FIG. 3 of the present disclosure and associated clock signal setup which places the clock signal CLKp to turn-on voltage level at the moment of the clock signal CLKn in its rising edge, so that potential level at the pull-down node PD will be pulled up which in turn pulls down potential level at the N-th gate-drive signal output port. As a result, the current-stage, i.e., the N-th, gate-drive signal output port Gout(N) can properly reset to turn-off voltage level to ensure that no incorrect multi-outputs are produce. In some embodiments, additionally, the shift register unit 300 of FIG. 3 is able to use a (N+3)-th carry signal output port to further reset the potential levels of the pull-up node PU and the N-th carry signal output port Cout(N) to turn-off voltage level.

In an alternative, embodiment, the present disclosure provides a method of driving the shift register unit described above. The shift register unit is an N-th unit, as shown in FIG. 1 or FIG. 3, of one of multi-stage series of GOA circuit. The method includes controlling a p-th clock signal CLKp to be set to turn-on voltage level at a time when the n-th clock signal CLKn is at its rising edge from turn-off voltage level to turn-on voltage level. The clock signal control is set under a partial overlapping for all four clock signals of CLK1, CLK2, CLK3, CLK4 received by each shift register unit. Further, the method includes using turn-on voltage level at the p-th clock signal to control the pull-down node PD to be set to turn-on voltage level. Additionally, the method includes resetting potential level of the N-th gate-drive signal output port to turn-off voltage level. Here N is a positive integer. Furthermore, the method includes setting a to be a remainder of N divided by 4 or setting n to be 4 if N is divisible by 4. Moreover, the method includes setting p to be a remainder of (n+3) divided by 4 or setting p=4 if (n+3) is divisible by 4.

In some embodiments, the method of the present disclosure is to operate the shift register unit of FIG. 1 or FIG. 3 under the clock signal setting shown in FIG. 2 during a time period when the n-th, clock signal CLKn is at turn-on voltage level, which is a time period likely to cause incorrect multi-outputs at the gate-drive signal output port, to use a turn-on voltage level at the p-th clock signal CLKp to set the pull-down node PD to turn-on voltage level for resetting the gate-drive signal output port to turn-off voltage level. Thus, the possible multi-outputs issue is resolved.

In certain specific embodiments, the method also includes controlling resetting of potential level at the N-th gate-drive signal output port to turn-off voltage level when the (N+3)-th carry signal output port outputs a turn-on voltage level signal. The method includes further resetting potential level of the N-th gate drive signal output, port to turn-off voltage level using the turn-on voltage level signal at the (N+3)-th carry signal output port.

In another alternative embodiment, the present disclosure provides a gate driver on array (GOA) circuit that is formed by cascading M numbers of shift register units in a multi-stage series. Each of the M numbers of shift register units is the shift register unit of the present disclosure as shown in FIG. 1 or FIG. 3, M is an integer equal to or greater than N.

In yet another alternative embodiment, the present disclosure provides a display apparatus including the GOA circuit shown above.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of driving a shift register unit, wherein the shift register unit is an N-th unit cascaded in the multi-stage gate driving circuit, wherein N is a positive integer, the N-th unit comprising:
   an N-th gate-drive signal output port;
   a gate-drive output sub-circuit including a capacitor connected between a pull-up node and the N-th gate-drive signal output port, and configured to output an n-th dock signal at the N-th gate drive signal output port, wherein n to be a remainder of N divided by 4 or n=4 if N is divisible by 4;
   a pull-up control sub-circuit connected to an (N−1)th gate-drive signal output port of a previous adjacent (N−1)th unit, a pull-down node, the pull-up node, and a fixed voltage port set to turn-off voltage level, and controlled by a m-th clock signal, wherein m is a remainder of (n+2) divided by 4 or equal to 4 if (n+2) is divisible by 4; and
   a pull-down control sub-circuit connected to the pull-up node, the fixed voltage port set to turn-off voltage level, the (N−1)th gate-drive signal output port, and the pull-down node, and controlled by the n-th clock signal and a p-th clock signal, wherein p is a remainder of (n+3) divided by 4 or equal to 4 if (n+3) is divisible by 4;

the method comprising:
   controlling the p-th clock signal at turn-on voltage level during a time period corresponding to a rising edge of the n-th clock signal during which the n-th clock signal changes from turn-off voltage level to turn-on voltage level;

controlling the pull-down node to be set to turn-on voltage level when the p-th clock signal is at turn-on voltage level; and resetting potential level of the N-th gate-drive signal output port to turn-off voltage level.

2. A method of claim 1, further comprising setting the pull-up node to turn-on voltage level when receiving a turn-on voltage level signal from the (N−1)-th gate-drive signal output port, and setting the pull-up node to turn-off voltage level when the pull-down node or the m-th clock signal is at turn-on voltage level.

3. A method of claim 1, further comprising setting the pull-down node to turn-off voltage level when the pull-up node, the (N−1)-th gate-drive signal output port, or the n-th clock signal is set to turn-on voltage level, and setting the pull-down node to turn-on voltage level when the p-th clock signal is set to turn-on voltage level.

4. The method of claim 1, wherein the pull-down control sub-circuit comprises:
 a first pull-down control transistor having a gate connected to the pull-up node, a first terminal connected to the pull-down node, and a second terminal set to turn-off voltage level;
 a second pull-down control transistor having a gate connected to the (N−1)-th gate-drive signal output port, a first terminal connected to the pull-down node, and a second terminal set to turn-off voltage level;
 a third pull-down control transistor having a gate connected to the n-th clock signal, a first terminal connected to the pull-down node, and a second terminal set to turn-off voltage level; and
 a first reset transistor having a gate and a first terminal commonly provided with the p-th clock signal, and a second terminal connected to the pull-down node.

5. The method of claim 4, wherein the pull-up control sub-circuit comprises:
 an input transistor having a gate and a first terminal commonly connected to the (N−1)-th gate-drive signal output port, and a second terminal connected to the pull-up node;
 a pull-up control transistor having a gate connected to the pull-down node, a first terminal connected to the pull-up node, and a second terminal set to turn-off voltage level;
 a second reset transistor having a gate receiving the m-th clock signal, a first terminal connected to the pull-up node, and a second terminal set to turn-off voltage level; and
 a third reset transistor having a gate connected to an (N+3)-th carry signal output port of a (N+3)-th unit, a first terminal connected to the pull-up node, and a second terminal set to turn-off voltage level.

6. The method of claim 5, wherein the gate-drive output sub-circuit comprises:
 an output pull-up transistor having a gate connected to the pull-up node, a first terminal receiving the n-th clock signal, and a second terminal connected to the N-th gate-drive signal output port;
 an output pull-down transistor having a gate connected to the pull-down node, a first terminal connected to the N-th gate-drive signal output port, and a second terminal set to turn-off voltage level; and
 a fourth reset transistor having a gate connected to the (N+3)-th carry signal output port, a first terminal connected to the N-th gate-drive signal output port, and a second terminal set to turn-off voltage level.

7. The method of claim 6, wherein the N-th unit further comprises a carry signal output sub-circuit alternatively connected to the pull-up node and the pull-down node and controlled by the n-th clock signal to output a carry signal at an N-th carry signal output port.

8. The method of claim 7, wherein the carry signal output sub-circuit comprises:
 a carry pull-up transistor having a gate connected to the pull-up node, a first terminal receiving the n-th dock signal, and the second terminal connected to the N-th gate-drive signal output port; and
 a carry pull-down transistor having a gate connected to the pull-down node, a first terminal connected to the N-th carry signal output port, and a second terminal set to turn-off voltage level.

9. The method of claim 8, further comprising outputting the n-th clock signal at the N-th carry signal output port when the pull-up node is at turn-on voltage level and outputting a turn-off voltage level signal at the N-th carry signal output port when the pull-down node is at turn-on voltage level.

10. The method of claim 9, further comprising controlling resetting of potential level at the pull-up node and the N-th gate-drive signal output port to turn-off voltage level when the (N+3)-th carry signal output port outputs a turn-on voltage level signal.

11. The method of claim 1, wherein each of the n-th clock signal, the m-th clock signal, and the p-th clock signal comprises a duty cycle of ⅓ corresponding to a same period of T;
 the m-th clock signal being delayed by 0.5 T compared with the n-th clock signal; and
 the p-th clock signal being delayed by 0.75 T compared with the n-th clock signal.

12. The method of claim 11, wherein the (n=2) dock signal is delayed by T/4 compared with the (n=1) clock signal; and
 the (n=1) clock signal comprises turn-on voltage level during a first time period and the (n=2) clock signal comprises turn-on voltage level during a second time period, a last ¼ portion of the first time period overlaps with a first ¼ portion of the second time period.

13. The method of claim 8, wherein each of the first pull-down control transistor, the second pull-down control transistor, the third pull-down control transistor, the first reset transistor, the input transistor, the pull-up control transistor, the second reset transistor, the third reset transistor, the output pull-up transistor, the output pull-down transistor, the fourth reset transistor, the carry pull-up transistor, and the carry pull-down transistor is an n-type transistor.

14. A shift register unit cascaded in a multi-stage gate driving circuit, wherein the shift register unit is an N-th unit cascaded in the multi-stage gate driving circuit, wherein N is a positive integer, the N-th unit comprising:
 an N-th gate-drive signal output port;
 a gate-drive output sub-circuit including a capacitor connected between a pull-up node and the N-th gate-drive signal output port, and configured to control outputting of an n-th clock signal at the N-th gate drive signal output port when the pull-up node is at high voltage level, and to set low voltage level at the N-th gate-drive signal output port when a pull-down node is at high voltage level or an (N+3)-th carry signal output port of a (N+3)-th unit outputs a high voltage level signal, n being a remainder of N divided by 4 or equal to 4 if N is divisible by 4;

a carry signal output sub-circuit configured to control outputting of the n-th clock signal at the N-th carry signal output port when the pull-up node is at high voltage level and to control outputting of a low voltage level signal at an N-th carry signal output port when the pull-down node is at high voltage level;

a pull-up control sub-circuit connected to an (N−1)th gate-drive signal output port of a previous adjacent (N−1)th unit, a pull-down node, the pull-up node, and a fixed voltage port set to turn-off voltage level, and configured to set the pull-up node to high voltage level when a high voltage level signal is outputted at the (N−1)-th gate-drive signal output port from a previous adjacent shift register unit, and to set the pull-up node to low voltage level when the pull-down node, a m-th clock signal, or the (N+3)-th carry signal output port is at high voltage level, m being a remainder of (n+2) divided by 4 or equal to 4 if (n+2) is divisible by 4;

a pull-down control sub-circuit connected to the pull-up node, the fixed voltage port set to turn-off voltage level, the (N−1)th gate-drive signal output port, and the pull-down node, and configured to set the pull-down node to low voltage level when the pull-up node, the (N−1)-th gate-drive signal output port, or the n-th clock signal is set to high voltage level, and to set the pull-down node to high voltage level when a p-th clock signal is set to high voltage level, p being a remainder of (n+3) divided by 4 or equal to 4 if (n+3) is divisible by 4; and a clock signal generator configured to generate the n-th clock signal, the m-th clock signal, and the p-th clock signal;

wherein the p-th clock signal is at high voltage level when the n-th clock signal is on a rising edge from low voltage level to high voltage level.

15. The shift register unit of claim 14, wherein the pull-down control sub-circuit comprises:
  a first pull-down control transistor having a gate connected to the pull-up node, a first terminal connected to the pull-down node, and a second terminal set to turn-off voltage level;
  a second pull-down control transistor having a gate connected to the (N−1)-th gate-drive signal output port, a first terminal connected to the pull-down node, and a second terminal set to turn-off voltage level;
  a third pull-down control transistor having a gate connected to the n-th clock signal, a first terminal connected to the pull-down node, and a second terminal set to turn-off voltage level; and
  a first reset transistor having a gate and a first terminal commonly provided with the p-th clock signal, and a second terminal connected to the pull-down node.

16. The shift register unit of claim 14, wherein the pull-up control sub-circuit comprises:
  an input transistor having a gate and a first terminal commonly connected to the (N−1)-th gate-drive signal output port, and a second terminal connected to the pull-up node;
  a pull-up control transistor having a gate connected to the pull-down node, a first terminal connected to the pull-up node, and a second terminal set to turn-off voltage level;
  a second reset transistor having a gate receiving the m-th dock signal, a first terminal connected to the pull-up node, and a second terminal set to turn-off voltage level; and
  a third reset transistor having a gate connected to the (N+3)-th carry signal output port, a first terminal connected to the pull-up node, and a second terminal set to turn-off voltage level.

17. The shift register unit of claim 14, wherein the gate-drive output sub-circuit comprises:
  an output pull-up transistor having a gate connected to the pull-up node, a first terminal receiving the n-th clock signal, and a second terminal connected to the N-th gate-drive signal output port;
  an output pull-down transistor having a gate connected to the pull-down node, a first terminal connected to the N-th gate-drive signal output port, and a second terminal set to turn-off voltage level; and
  a fourth reset transistor having a gate connected to the (N+3)-th carry signal output port, a first terminal connected to the N-th gate-drive signal output port, and a second terminal set to turn-off voltage level.

18. The shift register unit of claim 14, wherein each of the n-th clock signal, the m-th clock signal, and the p-th clock signal comprises a duty cycle of ⅓ corresponding to a same period of T;
  the m-th clock signal being delayed by 0.5 T compared with the n-th clock signal; and
  the p-th clock signal being delayed by 0.75 T compared with the n-th clock signal.

19. A gate drive circuit comprising M numbers of shift register units cascaded m to multi-stage series, each of the M numbers of shift register units is the shift register unit of claim 14, M is an integer equal to or greater than N.

20. A display apparatus comprises a gate drive circuit of claim 19.

* * * * *